United States Patent [19]

Hakkarainen

[11] Patent Number: 5,675,336
[45] Date of Patent: Oct. 7, 1997

[54] ANALOG MEMORY UNIT

[75] Inventor: Juka Mikko Hakkarainen, Coconut Grove, Fla.

[73] Assignee: General Electric Company, Schenectady, N.Y.

[21] Appl. No.: 601,409

[22] Filed: Feb. 15, 1996

[51] Int. Cl.$^6$ .................... H03M 1/80; H02H 3/08
[52] U.S. Cl. .................... 341/135; 341/110; 341/153; 361/93
[58] Field of Search .................... 341/110, 135, 341/144, 145, 146, 147, 148, 153, 154; 361/93; 327/352, 361

[56] References Cited

U.S. PATENT DOCUMENTS

| | | | |
|---|---|---|---|
| 4,408,190 | 10/1983 | Nagano | 341/135 |
| 4,631,625 | 12/1986 | Alexander et al. | 361/94 |
| 5,136,458 | 8/1992 | Durivage, III | 361/93 |
| 5,254,993 | 10/1993 | Wölber et al. | 341/135 |

*Primary Examiner*—Todd DeBoer
*Attorney, Agent, or Firm*—Marvin Snyder

[57] ABSTRACT

An analog memory unit that can be implemented, at least in part, on an application specific integrated circuit (ASIC), utilizes at least the ASIC arithmetic logic unit (ALU) to enhance performance and to generate and store an accurate measure of power line thermal status. The memory unit includes an analog-to-digital (A/D) converter for converting an input analog signal from a parallel R-C circuit to a digital signal and a scaler for scaling the digital signal from the A/D converter to within a range acceptable for further processing. The memory unit also includes an arithmetic logic unit (ALU) which receives input signals from the scaler and from a digital thermal memory. The input signal supplied to the ALU from the digital thermal memory is a four bit (digital) value proportional to the measured actual thermal status of the subject power line. The output of the ALU is connected to the input of latches which latch, or store, the digital signal produced by the ALU. The ALU output signal is representative of the difference between charge on the R-C circuit and the most recently measured actual thermal status of the power line. The latches are connected to a digital-to-analog converter which has its output connected to the input of the A/D converter and to the R-C circuit.

17 Claims, 1 Drawing Sheet

ANALOG MEMORY UNIT

FIELD OF THE INVENTION

This invention relates generally to analog memory circuits and, more particularly, to analog memory circuits including a digital interface.

BACKGROUND OF THE INVENTION

Analog memory circuits often are used in controllers that may lose power. When power is cut-off to the controller, it often is preferable to retain information used by the controller and related to the system monitored/controlled by the controller. For example, known controllers are used in connection with, and form part of, a circuit breaker. The circuit breaker is electrically connected in a power delivery system, and the controller is connected to receive power from the power delivery system power lines.

In operation, the controller monitors many conditions of the power system power lines, including the power line thermal state. In the event that a fault is detected by the controller, the controller causes the circuit breaker to trip. If the circuit breaker trips, power typically is cut-off to the controller. When power is cut-off to the controller, data stored in the controller memory may be lost. For example, data stored in the controller random access memory (RAM) typically is lost when the controller power supply is cut-off.

When power is cut-off to a power line, it can be advantageous to determine the thermal cooling of the power line. Specifically, when power is distributed through a power line, the power line becomes heated to an operating temperature. When the power is cut-off, the power line begins to cool. By knowing the thermal cooling which has occurred on the power line, a utility worker may be able to more quickly identify the root cause of the fault and determine whether to restore power delivery through the subject power line.

Known parallel resistor-capacitor (R-C) circuits with a long time constant have been used for representing the thermal cooling of a power line when power is cut off. Although known circuit breaker controllers are implemented as application specific integrated circuits (ASICs), such R-C circuits often do not interface with the ASIC nor benefit from functions that can be performed by the ASIC. Of course, in an ASIC environment, efficient use of chip surface area is extremely important. Specifically, efficient use of chip surface area can increase the possibility for adding functionality to the ASIC and for reducing the ASIC cost.

It would desirable to provide an analog memory unit implemented at least in part on an ASIC controller and utilizing functions of ASIC components, e.g., the ASIC arithmetic logic unit (ALU), to store an accurate measure of power line thermal status. It also would be desirable to provide such an analog memory unit that does not occupy a large amount of ASIC surface area.

SUMMARY OF THE INVENTION

These desiderata and other objects may be attained in a memory unit which, in one embodiment, uses the computational power of an ASIC with a simple and accurate analog interface to a parallel R-C circuit. More specifically, in one embodiment, the memory unit includes an analog-to-digital (A/D) converter for converting an input analog signal from the R-C circuit to a digital signal and a scaler for scaling the digital signal from the A/D converter to within a range acceptable for further processing.

The memory unit also includes an arithmetic logic unit (ALU) which receives inputs from the scaler and from a digital thermal memory. In a circuit breaker application, the input signal supplied to the ALU from the digital thermal memory is a four bit (digital) value proportional to the measured, actual thermal status of the subject power line. The measured thermal status of the power line is provided to the digital thermal memory by other components of the circuit breaker.

The output of the ALU is connected to the input of latches which latch, or store, the digital output signal from the ALU. The ALU output signal is a difference signal representative of the difference, in digital form, between the R-C circuit charge and the most recently actually measured thermal status of the power line. The latches are connected to a digital-to-analog converter (D/A) which has its output connected to the input of the A/D converter and to the parallel R-C circuit.

By continuously updating the charge stored in the R-C circuit, an accurate measurement of power line thermal status is obtainable from the R-C circuit Further, if the power supply is lost, the charge stored in the R-C circuit will be proportional the thermal status, or temperature, of the power line substantially at the time of power loss. Therefore, since the charge present in the R-C circuit at the time of power loss is accurate, the accuracy of the reading obtained from the R-C circuit at a later time, subsequent to some discharge by the capacitor, will substantially accurately reflect the thermal cooling for the power line.

The above described memory unit provides the important advantage that such unit can be implemented, at least in part, on an ASIC and utilize at least the ASIC ALU to enhance performance and to generate and store an accurate measure of power line thermal status. In addition, the memory unit does not require a large amount of ASIC surface area.

BRIEF DESCRIPTION OF THE DRAWINGS

The features of the invention believed to be novel are set forth in the appended claims. The invention, however, together with further objects and advantages thereof, may best be understood by reference to the following description taken in conjunction with the accompanying drawing(s) in which:

DETAILED DESCRIPTION OF THE DRAWINGS

Figure 1:
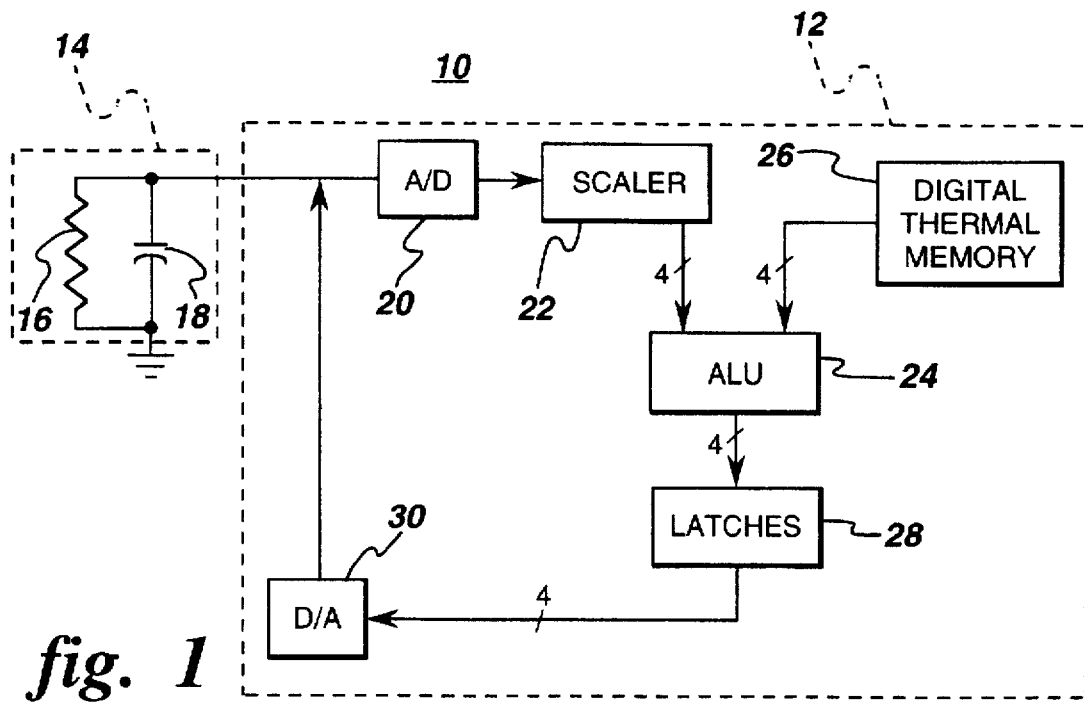
FIG. 1 is a block diagram of an analog memory unit in accordance to one embodiment of the present invention.

FIG. 1 is a block diagram of an analog memory unit 10 in accordance with one embodiment of the present invention. Although analog memory unit 10 may be used in many diverse applications, unit 10 is specifically described below in the context of circuit breaker applications. Therefore, it should be understood that the following description with respect to circuit breaker applications is by way of example only.

Further, components illustrated within a dashed box 12 in FIG. 1 represent components implemented on an application specific integrated circuit (ASIC). Components that are not within dashed box 12 are implemented external to the ASIC. Of course, certain components shown as being implemented on the ASIC could be implemented external to the ASIC in other embodiments, and certain components shown as being implemented external to the ASIC could be implemented on the ASIC in yet other embodiments.

Referring specifically to FIG. 1, memory unit 10 includes a parallel resistor-capacitor (R-C) circuit 14 including a resistor 16 and a capacitor 18. Resistor 16 and capacitor 18 are shown as being implemented external to the ASIC. Such parallel R-C circuits are well known in the art.

Memory unit 10 further includes an analog-to-digital (A/D) converter 20 for converting an input analog signal to a digital signal and a scaler 22 for scaling an input digital signal to within a range acceptable for further processing. The output of A/D converter 20 is connected to the input of scaler 22. Memory unit 10 also includes an arithmetic logic unit (ALU) 24 which is connected to receive input signals from scaler 22 and from a digital thermal memory 26. The output of ALU 24 is connected to the input of latches 28 which latch, or store, output signals from ALU 24. Latches 28 are connected to a digital-to-analog converter (D/A) 30 which has its output connected to the input of A/D converter 20 and to parallel R-C circuit 14.

With respect to a circuit breaker application, components such as ALU 24 may perform many functions in addition to generating a measure of power line thermal status. Therefore, components illustrated in FIG. 1, including ALU 24, are not necessarily dedicated to performing the thermal status operations described below. Further, certain functions illustrated as being performed by separate components could be performed by one component. For example, scaler 22 could be implemented within ALU 24. Particularly, ALU 24 could perform the scaling function and save intermediate results in a memory, e.g., a random access memory. In addition, memory unit 10, as shown, has a resolution of four (4) bits. The resolution of memory unit 10 may, however, be selected based on the resolution required for the specific application.

In operation, and in monitoring the thermal status of a power line, the sensed power line temperature is loaded into digital thermal memory 26. Such power line temperature sensing and loading of the sensed temperature into memory 26 is performed by circuit breaker components not illustrated in FIG. 1. Such circuit breaker components are well known in the art. The thermal status typically is represented and stored in memory 26 as a four bit value.

In a first clock cycle, A/D converter 20 samples the voltage across R-C circuit 14 (which is zero in its initial state) and generates a digital output signal representative of such voltage. The digital output signal from A/D converter 20 is scaled by scaler 22 so that the scaled, four (4) bit digital signal is proportional to the analog voltage across R-C circuit 14 and suitable for processing by ALU 24, e.g., between zero and five volts.

ALU 24 compares the scaled four bit digital signal with the four bit digital signal stored in memory 26 and representative of the most current thermal state of the power line. ALU 24 generates a four (4) bit digital difference signal representative of the difference between the scaled signal from scaler 22 and the stored value in memory 26, and the digital difference signal is supplied to latches 28.

D/A converter 30 samples the digital signals stored in latches 28, and converts the stored signals, i.e., the difference signals, into analog signals. The analog signals from D/A converter 30 are supplied to parallel R-C circuit 14 and charge capacitor 18. In this manner, the difference signals from ALU 24 control the amount of charge developed across R-C circuit 14.

As explained above, the difference signals from ALU 24 represent the difference between the charge stored in R-C circuit 14 representative of the power line thermal status and the most recent actual measured power line thermal status. By continuously updating the charge stored in R-C circuit 14, an accurate measurement of power line thermal status is obtainable from R-C circuit 14.

Further, if power supplied to the ASIC is interrupted, the charge stored in R-C circuit 14 will be proportional to the thermal status, or temperature, of the power line substantially at the time of power loss. Therefore, since the charge present on R-C circuit 14 at the time of power loss is accurate, the accuracy of the reading obtained from R-C circuit 14 at a later time, subsequent to some discharge by capacitor 18, will substantially accurately reflect the thermal cooling for the subject power line.

Memory unit 10 provides the important advantage that such unit 10 is implemented at least in part on the ASIC and utilizes at least ASIC ALU 24 to enhance performance and to generate and store an accurate measure of power line thermal status. In addition, memory unit 10 does not require a large amount of ASIC surface area.

Figure 2:
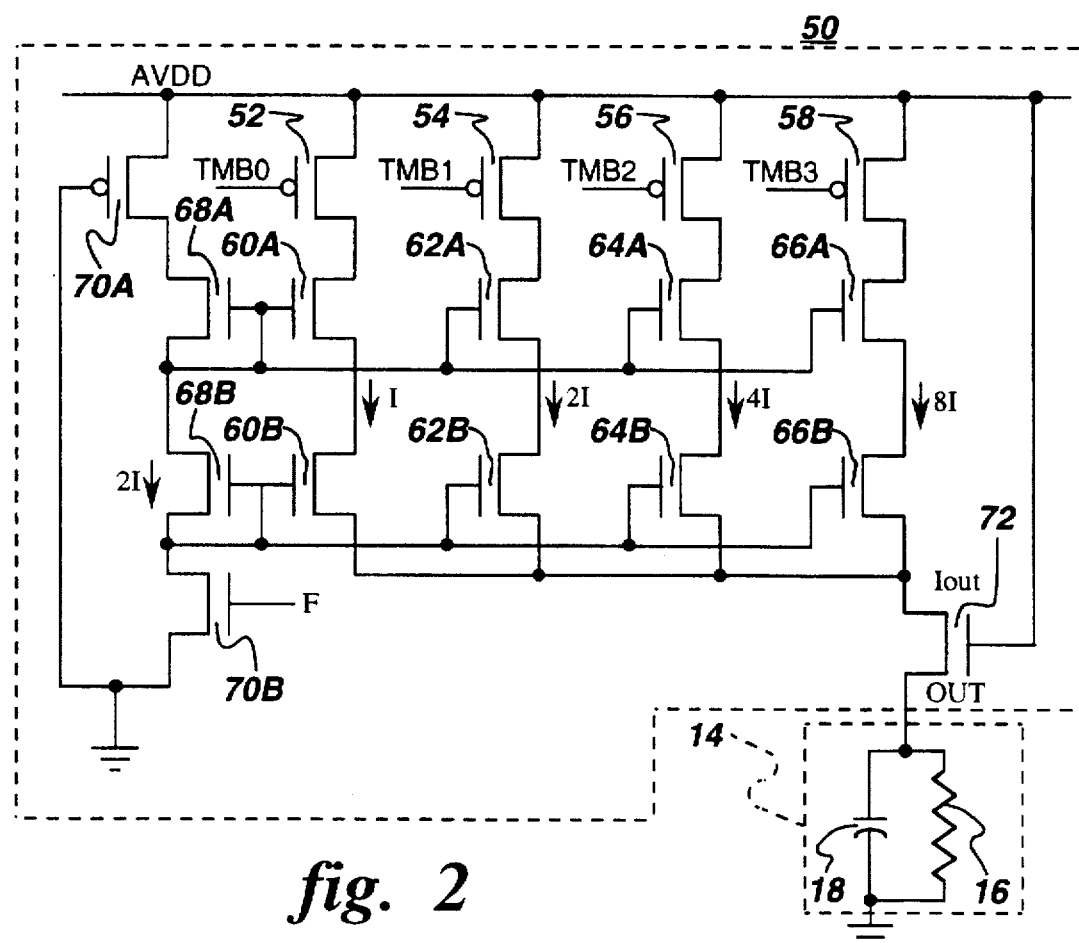
FIG. 2 is a circuit schematic diagram of a digital-to analog (D/A) converter connected to an external resistor-capacitor circuit.

FIG. 2 is a circuit schematic diagram of one embodiment of an digital-to analog (D/A) converter 50 connected to external R-C circuit 14. D/A converter 50 may be used as D/A converter 28 shown in FIG. 1 in a four bit resolution implementation. It should be understood, of course, that D/A converter 50 is described only by way of example and any one of many other types of D/A converters could be utilized in memory unit 10.

Referring specifically to FIG. 2, a supply voltage (AVDD) is provided to D/A converter 50 from the positive power supply rail of the ASIC. Control field effect transistors (FETs) 52, 54, 56 and 58 are coupled to supply voltage AVDD. The gates of control FETs 52, 54, 56 and 58 are connected to respective latches 28 (FIG. 1) which receive respective difference signals, in digital form, from ALU 24 (FIG. 1). Pairs of FETs 60A-B, 62A-B, 64A-B and 66A-B are connected to respective control FETs 52, 54, 56 and 58 and form a current mirror, as is well known in the art. When properly biased, FETs 60A-B generate a current equal to I, FETs 62A-B generate a current equal to 2I, FETs 64A-B generate a current equal to 4I, and FETs 66A-B generate a current equal to 8I.

A bias FET 68A is coupled to supply base currents to FETs 60A, 62A, 64A and 66A and a bias FET 68B is coupled to supply base currents to FETs 60B, 62B, 64B and 66B. Bias FETs 68A and 68B are energized by voltages supplied via control FETs 70A and 70B. A control FET 72 controls the supply of an output charge (Iout) to R-C circuit 14.

In operation, and by way of example, if the latch associated with control FET 52 has a digital (i.e., binary) one stored therein, FET 52 is biased to conduct so that FETs 60A-B generate a current I. If the latch associated with control FET 54 has a digital one stored therein, FET 54 is biased to conduct so that FETs 62A-B generate a current 2I. If the latch associated with control FET 56 has a digital one stored therein, FET 56 is biased to conduct so that FETs 64A-B generate a current 4I. If the latch associated with control FET 58 has a digital one stored therein, FET 58 is biased to conduct so that FETs 66A-B generate a current 8I.

Control FETs 52, 54, 56 and 58 may be energized in any combination. Output current Iout, therefore, is:

$$Iout=(B0\times I)+(B1\times 2I)+(B2\times 4I)+(B3\times 8I),$$

where bits B0, B1, B2 and B3 represent the digital value in the respective latch associated with FETs 52, 54, 56 and 58, as described above. Such bits B0, B1, B2 and B3 are sometimes referred to as thermal memory (TM) bits.

As a specific example, if D/A converter 50 is an eight bit converter, the 1x branch (e.g., FETs 52 and 60A-B) ideally carries 1 μA of current and the other branches carry 2 μA (2x branch), 4 μA (4x branch), 8 μA (8x branch), 16 μA (16x branch), 32 μA (32x branch), 64 μA (64x branch) and 128 μA (128x branch). Thus the maximum current with all branch currents on is 255 µA. If the size of capacitor 18 of R-C circuit 14 is 5 microfarads, the charging time from 0V to 2.5V with maximum current is about 50 msec.

If all digital bits driving D/A converter 50 are zero, R-C circuit 14 is not charged and also does not discharge, i.e., R-C circuit 14 discharges below the digital thermal level on its own and is not driven lower. D/A converter 50 could be configured to both charge and discharge R-C circuit 14, but only the charging function is necessary since R-C circuit 14 self-discharges.

In an eight bit implementation, the thermal memory bits (TMB0, TMB1, TMB2, TMB3, TMB4, TMB5, TMB6 and TMB7) are driven by output signals from ALU 24 (FIG. 1) as described above. The ALU output signal (i.e., the eight (8) most significant bits (MSBs) representing the difference signal) controls the amount of charging for each cycle (e.g., 50 msec. in this example). In this manner, the voltage stored in R-C circuit 14 is maintained near the maximum thermal accumulator (i.e., latches 28) value at all times, with a lag of at most 50 msec. for the specific example above.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. An analog memory unit comprising:

a parallel resistor-capacitor circuit comprising a resistor and a capacitor electrically connected in parallel;

an analog-to-digital (A/D) converter coupled to said parallel resistor-capacitor circuit for converting an analog output signal from said parallel resistor-capacitor circuit to a digital signal;

a scaler coupled to an output of said analog-to-digital converter for scaling a digital signal produced by said analog-to-digital converter;

a memory module having a digital value stored therein;

an arithmetic logic unit coupled to receive input signals from said scaler and from said memory module;

a plurality of latches coupled to an output of said arithmetic logic unit for accumulating digital output signal from said arithmetic logic unit; and a digital-to-analog converter having its output coupled to an input of said analog-to-digital converter and to said parallel resistor-capacitor circuit.

2. The analog memory unit of claim 1 wherein said scaler, said memory module and said arithmetic logic unit each have a resolution of four (4) bits.

3. The analog memory unit of claim 1 wherein said arithmetic logic unit is adapted to compare a scaled output signal from said scaler with said digital value stored in said memory module, and to produce a digital difference signal representative of a difference between the scaled signal and the stored digital value.

4. The analog memory unit of claim 1 wherein said analog-to-digital converter, said scaler, said memory module, said arithmetic logic unit, said latches, and said digital-m-analog converter are implemented on an application specific integrated circuit.

5. The analog memory unit of claim 4 wherein said parallel resistor-capacitor circuit is implemented on said application specific integrated circuit.

6. The analog memory unit of claim 1 wherein said digital-to-analog converter comprises a plurality of control field effect transistors and a current mirror, each of said control field effect transistors being electrically coupled to a respective branch of said current mirror, each of said branches being adapted to generate a current equal to a multiple of a base current.

7. The analog memory unit of claim 6 wherein each of said control field effect transistors is electrically coupled to a respective one of said plurality of latches.

8. The analog memory unit of claim 7 wherein an output signal Iout of said analog-to-digital converter is equal to:

$$Iout = (B0 \times I) + (B1 \times 2I) + (B2 \times 4I) + (B3 \times 8I),$$

where bits B0, B1, B2 and B3 represent digital value in one of said respective latches of said plurality of latches associated with said each of said control field effect transistors.

9. The analog memory unit of claim 6 wherein said analog-to-digital converter comprises an eight bit converter.

10. The analog memory unit of claim 9 wherein, when energized, said current mirror carries IgA of current in a first branch thereof, 2 µA in a second branch thereof, 4 µA in a third branch thereof, 8 µA in a fourth branch thereof, 16 µA in a fifth branch thereof, 32 µA in a sixth branch thereof, 64 µA in a seventh branch thereof, and 128 µA in an eighth branch thereof.

11. The analog memory unit of claim 10 wherein a maximum output signal from said digital-D-analog converter is 255 µA.

12. An analog memory unit comprising:

a parallel resistor-capacitor circuit comprising a resistor and a capacitor electdcal/y connected in parallel; and an application specific integrated circuit comprising:

an analog-to-digital (A/D) converter coupled to said parallel resistor-capacitor circuit for converting an analog output signal from said parallel resistor-capacitor circuit to a digital signal;

an arithmetic logic unit coupled to receive a signal representative of the digital output signal from said anaiog-to-digital converter;

a plurality of latches coupled to an output of said arithmetic logic unit for accumulating digital output signals from said arithmetic logic unit; and a digital-to-analog converter having its output coupled to an input of said analog-to-digital converter and to said parallel resistor-capacitor circuit.

13. The analog memory unit of claim 12 wherein said application specific integrated circuit further comprises:

a memory module having a digital value stored therein, said memory module being coupled to provide output signals to said arithmetic logic unit.

14. The analog memory unit of claim 13 wherein said arithmetic logic unit includes a scaler coupled to an output of said analog-to-digital converter for scaling a digital signal produced by said analog-to-digital converter.

15. The analog memory unit of claim 14 wherein said arithmetic logic unit compares a scaled digital output signal from said analog-to-digital converter with said digital value stored in said memory module, and said arithmetic logic unit produces a digital difference signal representative of a difference between the scaled signal and the stored digital value.

16. The analog memory unit of claim 13 wherein said digital-to-analog converter comprises a plurality of control field effect transistors, each of said control field effect transistors being electrically coupled to a respective branch of a current mirror, each of said branches being adapted to generate a current equal to a multiple of a base current.

17. The analog memory unit of claim 16 wherein each of said control field effect transistors is electrically coupled to a respective one of said plurality of latches.

* * * * *